United States Patent [19]

Maki

[11] Patent Number: 5,139,606
[45] Date of Patent: Aug. 18, 1992

[54] LASER BILAYER ETCHING OF GAAS SURFACES

[75] Inventor: Paul A. Maki, Harvard, Mass.

[73] Assignee: Massachusetts Institute of Technology, Cambridge, Mass.

[21] Appl. No.: 550,386

[22] Filed: Jul. 10, 1990

Related U.S. Application Data

[63] Continuation-in-part of Ser. No. 446,391, Dec. 5, 1989, abandoned.

[51] Int. Cl.$^5$ .......................................... H01L 21/306
[52] U.S. Cl. ................................ 156/643; 156/656; 156/662; 156/655; 430/313
[58] Field of Search ............ 156/628, 643, 656, 659.1, 156/662, 655; 430/313, 314

[56] References Cited

U.S. PATENT DOCUMENTS

| | | | |
|---|---|---|---|
| 4,462,846 | 7/1984 | Varshney | 437/69 |
| 4,494,997 | 1/1985 | Lemnios et al. | 437/22 |
| 4,632,710 | 12/1986 | Van Rees | 437/107 |
| 4,648,936 | 3/1987 | Ashby | 156/646 |
| 4,731,158 | 3/1988 | Brannon | 156/662 |
| 4,732,873 | 3/1988 | Perbet et al. | 437/101 |
| 4,746,622 | 5/1988 | Hawkins et al. | 437/53 |
| 4,877,757 | 10/1989 | York et al. | 437/228 |

FOREIGN PATENT DOCUMENTS 61-34926  2/1986  Japan .

OTHER PUBLICATIONS

M. Balooch, D. R. Olander, "The thermal and ion-assisted reaction of GaAs (100) with molecular chlorine", *J. Vac. Science Technology*, B 4(4) (1986), pp. 794–805.

P. Brewer, "Large Area Laser-Assisted Etching of Electronic Materials", *Proc. SPIE*, vol. 611 (1986), pp. 62–69.

J. J. Ritsko, F. Ho, J. Hurst, "Laser assisted chemical etching of copper", *Appl. Phys. Lett.*, vol. 53(1) (1988), pp. 78–80.

W. Sesselman, T. J. Chuang, "Chlorine surface interaction and laser-induced surface etching reactions", *J. Vac. Sci. Technology*, vol. B 3(5) (1985), pp. 1507–1512.

A. W. Tucker, M. Birnbaum, "Laser Chemical Etching of Vias in GaAs", *IEEE Electron Device Letters*, vol. EDL-4, No. 2 (1983), pp. 39–41.

D. J. Ehrlich, R. M. Osgood, T. F. Deutsch, "Laser-induced microscopic etching of GaAs and InP", *Appl. Phys. Letts.*, vol. 36(8), (1980), pp. 698–700.

P. Brewer, D. McClure, R. M. Osgood, "Excimer laser projection etching of GaAs", *Appl. Phys. Lett.*, vol. 49(13) (1986), pp. 803–805.

M. Hirose, S. Yokoyama, Y. Yamakage, "Characterization of photochemical processing", *J. Vac. Sci. Technology*, vol. B 3(5) (1985), pp. 1445–1449.

C. Ashby, "Photochemical dry etching of GaAs", *Appl. Phys. Lett.*, vol. 45(8), (1984), pp. 892–894.

R. Osgood, "An Overview of Laser Chemical Processing", *Mat. Res. Symp. Proc.*, vol. 74 (1987), pp. 75–87.

*Primary Examiner*—Kenneth M. Schor
*Assistant Examiner*—John J. Bruckner
*Attorney, Agent, or Firm*—Fish & Richardson

[57] ABSTRACT

A method of etching the surface of a substrate in a closed environment including the steps of contacting the surface of the substrate with a molecular chlorine etching gas, allowing a passivation layer to form on the surface of the substrate with atomic layer precision, and photochemically removing at least a portion of the passivation layer by irradiating the portion without destruction of the layer of material immediately underlying the passivation layer.

8 Claims, 3 Drawing Sheets

LASER BILAYER ETCHING OF GAAS SURFACES

The Government has rights in this invention pursuant to contract number F19628-85-C-0002 awarded by the Department of the Air Force.

BACKGROUND OF THE INVENTION

This application is a continuation in part of my copending application Ser. No. 07/446,391 filed Dec. 5, 1989.

This invention relates to etching the surface of a substrate.

Fabrication of semiconductor devices requires the formation of precise three-dimensional structures on a semiconductor material Such materials usually consist of a uniform substrate which can be prepared in a variety of ways. Epitaxy, for instance, is a deposition process in which a single crystal of a material is grown on the surface of a substrate, and requires that the surface of the substrate must be free of impurities, such as oxides and absorbed contaminants, for optimal epitaxial growth.

Patterning of a semiconductor surface can be accomplished by etching processes. The first step of many such processes involves imaging the surface with a resist to protect the areas that will not be removed. An etchant then is used to remove exposed areas of the surface not protected with photoresist. Once the surface is etched in the desired way, the resist material is removed.

Other approaches to etching are described in Ashby et al., U.S. Pat. No. 4,638,936, issued Mar. 10, 1987 and Balooch et al., *Journal of Vacuum Science Technology* B 4 (4), Jul./Aug. 1986. Ashby describes a method of photochemically etching the surface of a GaAs substrate by irradiating selected areas of the substrate to cause these areas of to react with a reactive chlorine species. Samples of n-GaAs (100) and p-GaAs (100) doped with Si and Zn, respectively, are exposed to a reactive chlorine species (e.g., $Cl$ and $Cl^-$) generated in a dc plasma located upstream of the GaAs. Irradiation of the GaAs substrate with a focused $Ar^+$ laser operated at 514.5 nm in the $TEM_{00}$ mode (using typical laser powers in the range of 10 $W/cm^2$ to several thousand $W/cm^2$), produces electron-hole pairs in the irradiated areas of the GaAs surface. These electron-hole pairs increase the reaction rate between the GaAs surface with the reactive gas-phase chlorine species to produce $AsCl_3$ and $GaCl_3$ which, because of the elevated temperature of the substrate, are volatile and evaporate. In Ashby's method, the etching rate is controlled by the photochemical formation of $AsCl_3$ and $GaCl_3$, which evaporate freely from the surface due to the elevated substrate temperature.

Balooch describes studies of thermal and ionassisted reactions of GaAs (100) with molecular chlorine. Exposure of GaAs substrate to a $Cl_2$ beam produces $AsCl_3$ and $GaCl_3$ on the substrate surface. The $AsCl_3$ product rapidly desorbs from the substrate while the relatively non-volatile $GaCl_3$ remains until it is removed with an ion beam.

SUMMARY OF THE INVENTION

The present invention relates to etching the surface of a substrate in a closed environment.

In one aspect of the invention, the method includes the steps of contacting the surface of the substrate with an etching gas, allowing a passivation layer to form on the surface of the substrate with atomic layer precision, the passivation layer inhibiting further reaction between the substrate and the etching gas, and photochemically removing a portion of the passivation layer by irradiating the portion with a radiation source to expose a portion of the substrate corresponding to the removed portion of the passivation layer.

Preferred embodiments of this aspect of the invention may include any of the following. The surface is in constant contact with the etching gas and a new passivation layer forms on the portion of the substrate after the irradiation, and the method may further include the step of photochemically removing the new passivation layer. The radiation source is a laser, which is pulsed, and each laser pulse removes a portion of the passivation layer to expose a corresponding portion of the substrate, and a corresponding new passivation layer forms on the exposed portions of the substrate between pulses. Each of the pulses has a fluence sufficient to desorb the passivation layer at the desired rate, but low enough such that photothermal effects do not occur. The laser is an excimer laser operating at a wavelength of 193 nm. The semiconductor material comprises a III-V compound, and in particular, is gallium arsenide, and the etching gas is molecular chlorine. The method further includes the step of depositing a layer of material on the etched surface of the substrate by molecular beam epitaxy.

The invention improves the accuracy of etching without sacrificing the quality of the resulting surface. The invention allows structuring of materials with atomic-layer depth precision. The low fluence laser pulses allow precise areas of the substrate to be etched away without damage to the resulting surface or unetched areas.

Other features and advantages of the invention will be apparent from the following description of the preferred embodiments, and from the claims.

DESCRIPTION OF THE PREFERRED EMBODIMENTS

We first briefly describe the drawings.

It is desirable that a semiconductor substrate be overgrown and the overgrowth etched in an efficient and precise manner without crystal defects and contamination. The present invention enables growth and photochemical etching of a single crystal on the surface of a semiconductor substrate to be performed with atomic layer precision within a closed system to avoid contamination by ambient contaminants and oxidants. This is achieved in an apparatus that facilitates growing a crystal on the surface of a substrate, contacting the grown crystalline substrate surface with an etchant, allowing the etchant to react with the substrate surface to form a passivation layer with atomic layer precision, and photochemically removing a portion of the passivation layer.

The crystal growth is preferably achieved in a molecular beam epitaxy (MBE) system, and the photochemical etching is performed in a connected etching chamber. The preferred etchant is chlorine gas, and the passivation layer is preferably removed with laser irradiation. The use of low-fluence laser irradiation at low etchant pressures permits patterned removal of the passivation layer to a precisely controlled depth.

STRUCTURE

Figure 1:
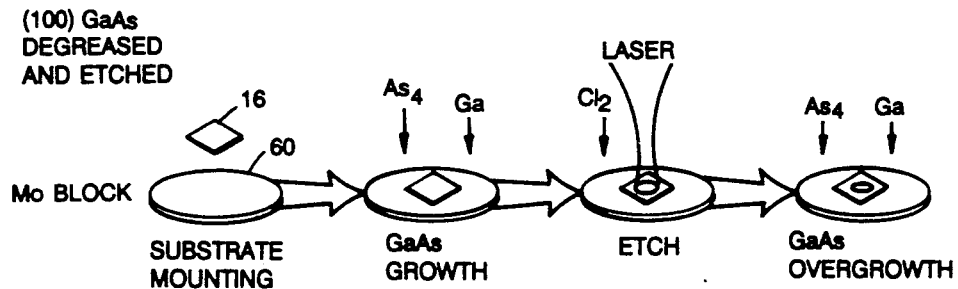
FIG. 1 is a schematic view of the laser etching/MBE chamber of the present invention.

FIG. 1 is a schematic drawing of an exemplary apparatus of the present invention. Apparatus 10 includes an ultra-high vacuum MBE chamber 12 and an ultra-high vacuum etching chamber 14, for performing in situ growth on and etching of semiconductor substrate 16, respectively. An ion pump 24 creates and maintains the ultra-high vacuum in etching chamber 14.

A GaAs substrate 16 is fixedly mounted on a molybdenum block (not shown) on a mounting arm 18. Arm 18 is connected, in turn, to a control handle 20 for positioning of substrate 16 in the etching chamber and for transferring of the substrate into and out of the MBE chamber through a gate valve 22. Mounting arm 18, control handle 20, and gate valve 22 are constructed to maintain the ultra-high Vacuum conditions present in etching chamber 14.

Substrate 16 is exposed to an etchant, such as chlorine gas, in etching chamber 14, which admits the etchant through a leak valve 28. The pressure within the etching chamber is monitored using a cold cathode gauge 30. During the etching process, a gate valve 26 isolates the etching chamber from the ion pump 24, and the etching chamber is not further evacuated except for the residual pumping by cold cathode gauge 30.

A UV-grade fused-silica window 32 admits patterned laser light 34 into etching chamber 14 and onto substrate 16. Patterned laser light 34 originates from a radiation source 36 which, in this embodiment, is an ArF excimer laser that emits 193 nm radiation, although it can generally be any radiation having sufficient energy to induce photochemical removal of the passivation layer, e.g., radiation in the ultra-violet region. The laser light passes through a mask 38, and is focused through optical elements 40 and 42 into the etching chamber 14 and on to the substrate surface. Mask 30 may be a binary mask having information relating to the pattern to be etched on substrate 16. In a preferred embodiment, mask 38 contains a positive image of the pattern to be etched. That is, the areas (not shown) of mask 38 that transmit the laser light correspond to the areas of substrate 16 to be etched. Optical elements 40 and 42 are a mirror and focusing lens, respectively, and serve to direct and focus the patterned laser light 34 onto substrate 16.

MBE chamber 12 is constructed as is known in the art. For instance, MBE chamber 12 has a substrate holder 43 on an arm 44 positioned by a micrometer assembly 46. MBE chamber 12 is sealed from the atmosphere and is evacuated by an ion pump 48. A gate valve 50 isolates ion pump 48 from MBE chamber 12 when required, and a port 52 is provided for analysis and characterization equipment, such as a reflection electron diffraction (RED) apparatus. Finally, a plurality of elemental-source samples 54 and 56 are provided to supply the necessary constituents for the MBE crystal growth. The source samples 54 and 56 are, in this embodiment, a gallium and an arsenic sample, respectively.

Preferred embodiments of the etching technique of the present invention are based on photochemical etching of a GaAs semiconductor in a low-pressure etchant atmosphere (e.g., chlorine gas) to effect a spontaneous, self-terminating reaction of the GaAs surface to produce a passivation layer. A low fluence laser pulse is used to photochemically desorb reaction products of the passivation layer that are nonvolatile at the etching temperature After a portion of the passivation layer is removed, the newly uncovered GaAs surface, which was beneath the removed portion of the passivation layer, is exposed to and now reacts with the ambient chlorine gas to create another passivation layer. Another low fluence laser pulse is used to desorb this layer. The repetition continues until the desired etch depth is obtained. Unlike ions typically used in ion assisted etching, low fluences of photons are absorbed by bulk-lattice electronic transitions and are less likely to cause damage to the GaAs surface.

EXAMPLE 1

Figure 2:
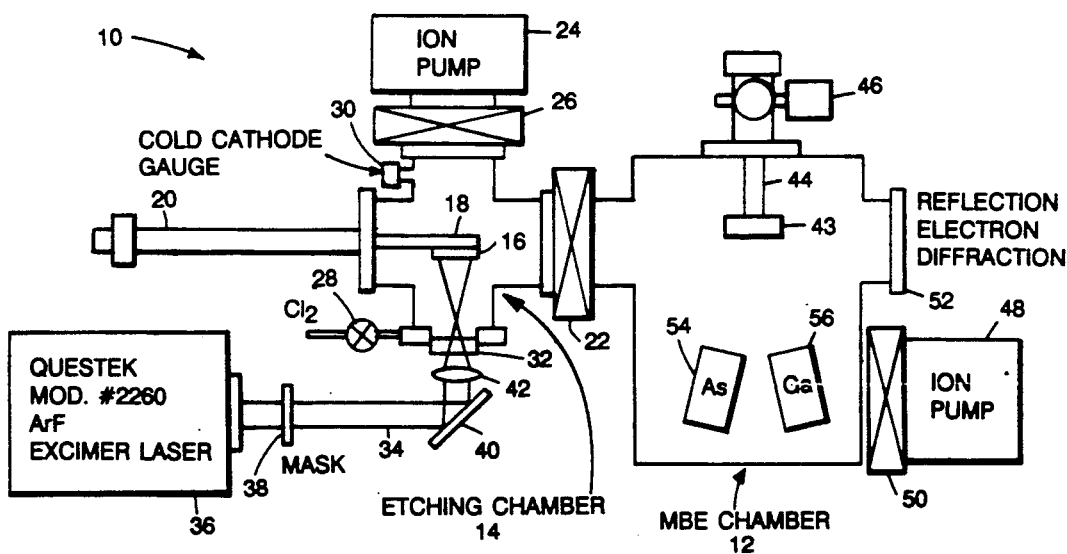
FIG. 2 is a schematic sketch of a process of the invention.

In a preferred method of the invention, described with reference to FIGS. 1 and 2, a prepolished GaAs(100) substrate 16, degreased and etched with 5:1:1 $H_2SO_4$, $H_2O_2$, $H_2O$, is mounted on a molybdenum block 60 using indium solder. The molybdenum block is in turn attached to sample holder 18 and loaded into MBE chamber 12, where a 0.5 $\mu$m epitaxial film 62 of gallium arsenide (GaAs) is grown on substrate 16 using typical MBE growth procedures and conditions known in the art. After the growth, the substrate 63 is cooled to room temperature and transferred into etching chamber 14 through gate valve 22, using mounting arm 18 while maintaining the ultra-high vacuum conditions. By performing these steps within the closed environment of the interconnected sealed chambers 12 and 14, substrate 16 is kept free of any substantial oxides or impurities.

After gate valve 22 has been closed to isolate etching chamber 14 from MBE chamber 12, the epitaxial film surface of substrate 16 is exposed in etching chamber 14 to chlorine gas at a pressure of approximately $5 \times 10^{-3}$ torr through leak valve 28. The pressure is monitored using cold cathode gauge 30. During the etching process, ion pump 24 is isolated from etching chamber 14 by gate valve 26.

While the chlorine gas is present in the etching chamber, the ArF excimer laser beam is passed through binary pattern mask 38 and introduced through UV-grade fused-silica window 32, preferably with the beam axis normal to the sample surface, to irradiate the surface of substrate 16 with the pattern contained in binary pattern mask 38. Laser beam 34 is pulsed at a frequency in the range of approximately 0.02 Hz to 180 Hz. In the steady state saturated reaction regime (see discussion below) at room temperature, however, a pulse rate of approximately 0.2 Hz and a fluence of approximately 11 mJ/cm$^2$ is preferred for laser beam 34. Under these conditions, the laser pulses instantaneously remove or desorb all of the irradiated passivation layer. As a practical matter, the laser pulses do not remove or damage the GaAs crystal beneath the passivation layer.

After the etching process, etching chamber 14 is evacuated using ion pump 24, and etched sample 16 is transferred back to MBE chamber 12 for further growth if desired.

The interaction between the gallium arsenide epitaxial film and chlorine gas proceeds in steps. At room temperature, chlorine gas is thought to adsorb rapidly onto the surface of the GaAs substrate. In a first reaction step, the chlorine gas reacts with the gallium arsenide surface to form monochlorides and/or dichlorides of gallium and arsenic. In a second, slower reaction step, gallium and arsenic trichlorides are formed. Since arsenic trichloride is more volatile than gallium trichloride, which evaporates very slowly at room temperature, preferential evaporation of the former in the vacuum of the apparatus leaves a thin passivation layer of gallium trichloride on the surface of the epitaxial film space. The formation of the passivation layer, which as presently understood is unreactive to the etchant, leads to efficient self-termination of the reaction by forming a physical barrier and makes the process self-limiting. The complete mechanism is as follows:

  (1)

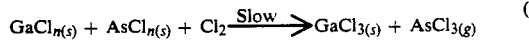  (2)

  (3)

The morphology of the etched surface varies significantly with the laser pulse repetition rate and fluence, and chlorine pressure. It has been found that the smoothness of the surface starts to degrade at high pulse energies (>18 mJ/cm$^2$) or high pulse repetition rates (>10 Hz), with chlorine gas at a pressure of approximately 5×10$^{-3}$ torr using an ArF laser emitting light at 193 nm. Mirror-like smooth surfaces are generally obtained at low pulse rates for gallium arsenide etching, which allows complete formation of the passivation layer between pulses. After its complete formation the laser pulse cleanly removes the passivation layer. This is desirable when precise etching is required.

At high pulse rates, the laser pulse desorbs reaction products from different stages of the reaction (e.g., the gallium and arsenic monochlorides and dichlorides of reaction (1) above). Nonetheless, controllable etching is possible because of the ability to interrupt the reaction precisely in time by controlling the pulse rate while fixing the other relevant parameters, such as pressure and temperature.

EXAMPLE 2

Figure 3A:
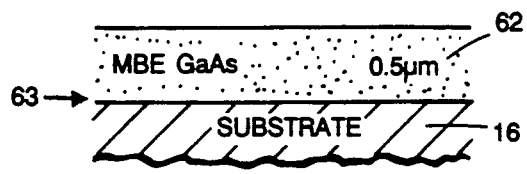
FIGS. 3a–3c are cross sectional views of an element fabricate by the process of FIG. 2.
Figure 3B:
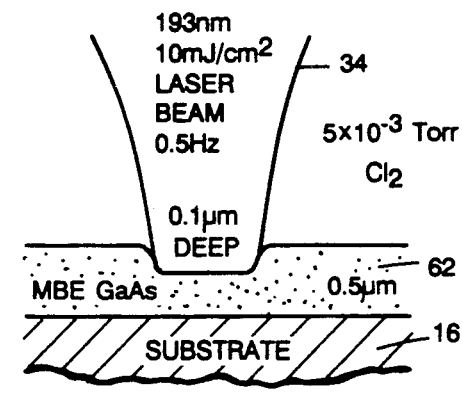
Figure 3C:
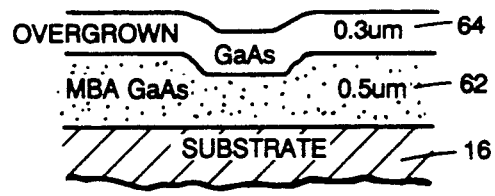

FIG. 3 shows a schematic of a GaAs surface undergoing processing in the apparatus as shown in FIG. 1. The sequence of steps shown in FIG. 3 is a growth of a 0.5 μm thick GaAs layer 62, followed by etching the GaAs layer in the presence of 5×10$^{-3}$ torr Cl$_2$ using an ArF excimer laser tuned to 193 nm and a power of 12 mJ/cm$^2$. The depth of the etched region of the substrate was measured to be 0.1 μm using a surface profilometer. The pattern was projected onto the surface using a mask and lens external to the etching chamber, as described in above, and pulsed at ~0.5 Hz. In a further step, a 0.3 μm layer 64 of GaAs was overgrown on the surface of the etched substrate 16, in MBE chamber 12. The substrate could then be further etched as desired. The surface of the overgrown film was found to be smooth and epitaxial in appearance and free of any abnormal nucleated defects, and there was no increase in structural defect levels during the processing over the base-line performance of the MBE machine. Unlike ion beam assisted etching, which can cause significant surface damage, the laser assisted photochemical desorption removes the passivation layer without damage to the underlying crystal. This is important because overgrowth may depend on the morphology of the underlying structure.

EXAMPLE 3

Figure 4:
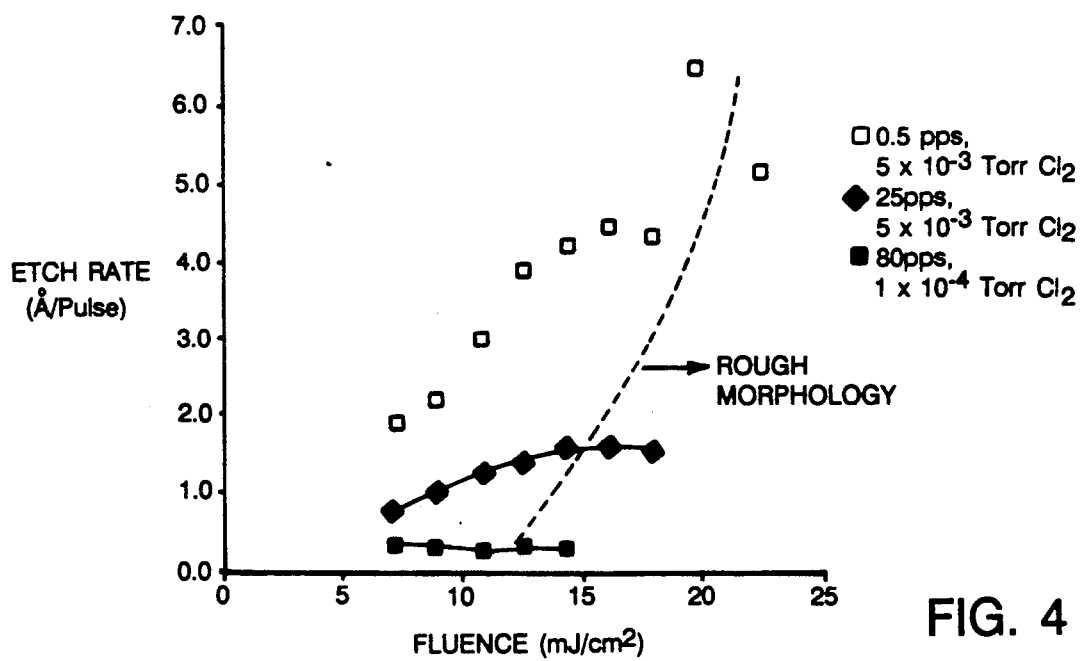
FIG. 4 is a graph depicting the effect of laser fluence on the etching rate of a substrate.

Referring to FIG. 4, the etch depth of a GaAs substrate in angstroms per laser pulse was determined at different laser fluences, pulse repetition rates, and chlorine gas pressures. At the higher pressure (5×10$^{-3}$ torr, 0.5 and 25 pulses per second), the etch depth per pulse increased almost linearly from the minimum fluence of 7 mJ/cm$^2$ and then saturates at a nearly constant depth in the region from approximately 13 to 18 mJ/cm$^2$. This saturation is indicative of nearly complete formation and complete laser-induced desorption of the gallium chloride passivation layer. Note that this etch depth at saturation increases with reduced laser pulse repetition rate and that the data with fluences below saturation (i.e., ~13 mJ/cm$^2$) extrapolate towards zero fluence without showing a thermal-type Arrhenius characteristic. This is characteristic of a photochemical desorption process as opposed to a photothermal desorption which would show a Arrhenius-type behavior. Furthermore, the low fluences used are insufficient to thermally desorb the GaCl$_3$ passivation layer by substrate heating.

In most of this saturated and pre-saturated region, smooth surfaces with roughness less than ~300 Å peak-to-peak, as determined by optical inspection and profilimetry, are obtained. The smoothness of the surface is ultimately limited by the smoothness of the initial surface before etching, although the etching process can improve the smoothness of some surfaces roughened during epitaxial growth. Above ~18 mJ/cm$^2$ the etched surface becomes rougher, and etch rates are less controllable. It is believed that laser-induced thermal effects come into play at even higher fluences. The photon energy, pulse energy, and pulse duration are chosen such that the passivation layer can be removed photochemically without substantial heating of the substrate. The determination of the required radiation parameters are apparent at the time of the etching. Measurement of the absolute power is, of course limited by the specifics of the measurement technique. The desirable pulse energy range is up to and including the saturated region (13-18 mJ/cm$^2$) of FIG. 4.

EXAMPLE 4

Figure 5:
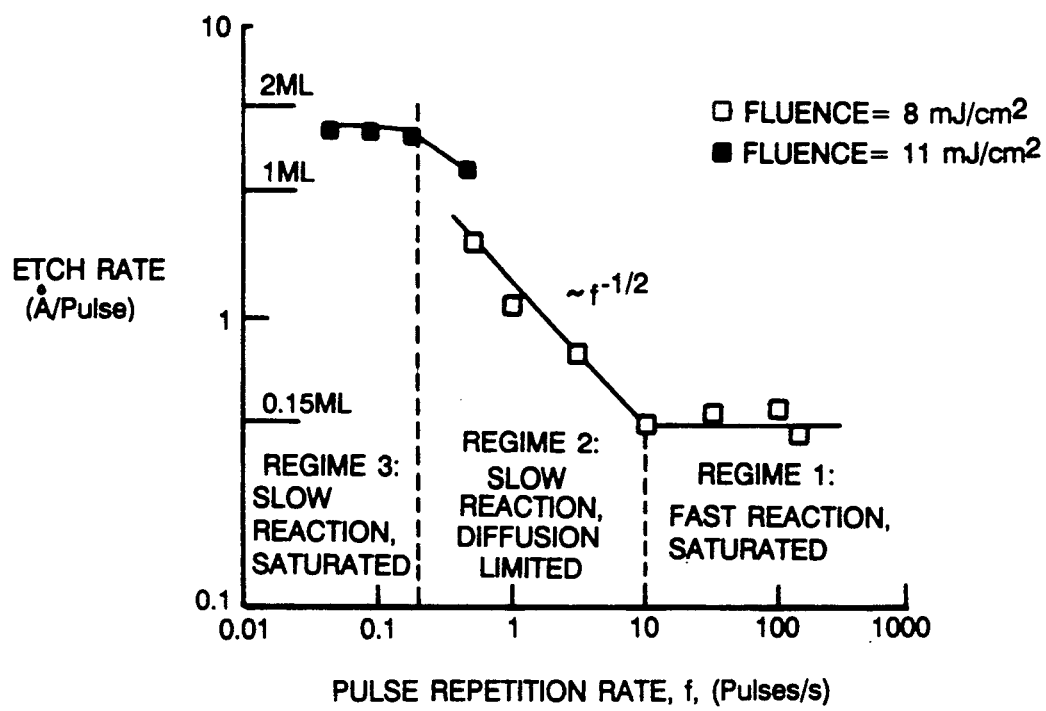
FIG. 5 is a graph depicting the effect of laser repetition rate on the etching rate of a substrate.

Referring now to FIG. 5, there is shown the temporal mapping of the reaction GaAs/Cl$_{2(g)}$ which is obtained by varying the laser pulse repetition rate. The etch depth per pulse is plotted against the pulse repetition rate on a log-log scale. Three clear regimes are seen.

The first regime at short pulse intervals (10–150 pulses per second repetition rate) is characterized by a constant etched thickness of ~0.3 Å per pulse (~0.1 monolayer per pulse at 8 mJ/cm$^2$). As explained below, this is termed the "fast reaction saturation" regime. In the second intermediate regime (~0.2 to 10 pulses per second) the etch depth increases as the inverse square root of the repetition rate. This is termed the "diffusion-limited" regime. In the third regime (0.05 to 0.2 pulses per second) the thickness again becomes constant, this time at ~4.4 Å per pulse (~1.6 monolayers per pulse at 11 mJ/cm$^2$). We term this the "slow reaction saturation". The absolute etch depth in these three temporal regimes varies with fluence (as indicated in FIG. 4) according to the efficiency with which the non-volatile surface layer is removed by the laser pulses and the reaction sequence re-initialized.

Figure 6:
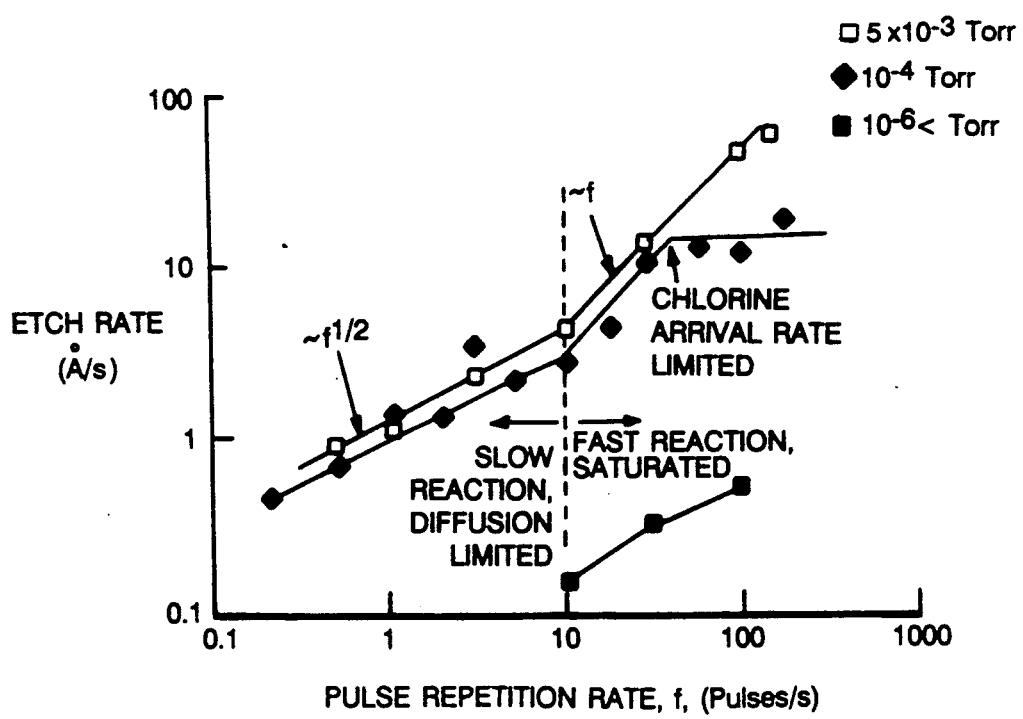
FIG. 6 is a graph depicting the effect of laser repetition rate on the etching rate of a substrate at different etchant pressures.

FIG. 6 shows the variation of the etch rate in Å/sec with chlorine pressure and repetition rate on a log-log scale. Below 40 Hz the reaction is only weakly dependent on the chlorine pressure in the pressure range from $10^{-4}$ to $5 \times 10^{-3}$ torr; this is associated with a surface saturated with absorbed chlorine. At the lower chlorine pressure ($<10^{-4}$ torr) and pulse rate above 60 Hz, etch rate saturation is associated with the reaction being limited by the chlorine arrival rate. In general, the lower chlorine pressures can be used at lower pulse rates without affecting the process. The upper limit on chlorine pressure is governed by experimental condition such that no liquid phase of etch products is formed on the surface. The formation of a liquid phase results in rapid free etching of the surface. For GaAs and chlorine, this limit is in the range of 10 mtorr to 100 mtorr in our system.

Although not wishing to be bound by theory, we believe that the fast reaction saturation of FIG. 5 is associated with completion of reaction (1), as shown above. This reaction consists of two steps: adsorption of $Cl_2$ and reaction to the chlorides. The adsorption of $Cl_2$ on clean GaAs is efficient. If the reaction to the monochlorides and dichlorides (i.e., $GaCl_n$ and $AsCl_n$, $n=1,2$) is rapid, the speed of reaction (1) at least at low pressures approaches the surface collision frequency of $Cl_2$, i.e., at $10^{-4}$ torr pressure, $3.8 \times 10^{16}$ cm$^{-2}$s$^{-1}$. Since there are $6.3 \times 10^{-14}$ cm$^{-2}$ exposed atoms on the surface (i.e., half a molecular GaAs monolayer for the GaAs (100) surface), this corresponds to an average of 60 collisions per second per atomic surface site. The onset of saturation of the fast reaction at this pressure occurs at ~10-50 Hz, i.e., approximately equal to the inverse of this time, and is consistent with the quantum yield in reaction per collision being of order unity. The etch depth associated with the first regime saturation, ~1.6 Å/pulse (FIG. 4, 25 Hz), suggests that the reacted sites for the saturation cover ~50% of the GaAs molecular monolayer (2.8 Å thick) and is consistent with this interpretation.

Regime 2 can be ascribed to reaction (2), limited by the diffusion of $Cl_2$ to active subchloride sites or diffusion of products away from these sites. For example, it may be controlled by the diffusion of either vacancies or reactant through a two-dimensional product layer adjacent to a reaction site, such as a terrace step. This leads to a $t^{-\frac{1}{2}}$ dependence through a parabolic law similar to that often observed in oxidation. In the simplest instance, the mobile surface species is adsorbed $Cl_2$, and the rate of the reaction follows the $Cl_2$ adsorption isotherm, which at the pressure of the experiment maps into a sublinear pressure dependence, as observed.

Regime 3 corresponds to the complete consumption of available surface sites for chlorination and, at room temperature, very slow evolution of new sites by reaction (3). Efficient self-termination is indicated by the hard saturation near one GaAs molecular bilayer thickness (FIG. 5) and the observation of negligible etching without laser-stimulated desorption.

Other embodiments are within the following claims. For example, the novel process of the invention may be used to etch other III-V semiconductor substrates, such as InP or $Al_xGa_{1-x}As$ ($0<x\leq 1$). The material deposited in the MBE chamber may be different than the substrate, making in situ processing of heterostructures possible. Further, other growth methods can be used such as organometallic vapor phase epitaxy. The removal of the passivation layer may be accomplished by other methods. For example, other sources of the radiation may be used, such a pulsed xenon or a mercury vapor lamp.

What is claimed is:

1. A method for nondestructively photochemically etching a surface of a semiconductor substrate, comprising the steps of:
   a. providing a semiconductor material with a surface;
   b. contacting said surface with a non-activated etching gas consisting essentially of $Cl_2$;
   c. allowing a passivation layer to form on said surface with atomic layer precision by adsorption of said etching gas and reaction of the etching gas and surface; said passivation layer inhibiting further reaction between said substrate and said etching gas; and
   d. photochemically desorbing a portion of said passivation layer by irradiating said portion with a laser to expose a portion of said substrate corresponding to said desorbed portion of said passivation layer, said laser providing sufficient energy so as to induce photochemical removal of said passivation layer without destruction of the layer of material immediately underlying the passivation layer.

2. The method of claim 1 wherein said surface is in constant contact with said etching gas and a new passivation layer forms on said portion of said substrate after said irradiation.

3. The method of claim 2 further comprising the step of photochemically removing the new passivation layer.

4. The method of claim 2 wherein said laser is pulsed, wherein each laser pulse removes a portion of passivation layer to expose a corresponding portion of said substrate, and a corresponding new passivation layer forms on said exposed portions of said substrate between pulses.

5. The method of claim 4 wherein said laser comprises an excimer laser operating at a wavelength of 193 nm.

6. The method of claim 1 wherein said semiconductor material comprises a group III-V compound.

7. The method of claim 6 wherein said group III-V compound comprises gallium arsenide.

8. The method of claim 1 further comprising the step of depositing a layer of material on the exposed portion of said substrate by molecular beam epitaxy.

* * * * *